United States Patent [19]

Ohigashi et al.

[11] 4,056,794
[45] Nov. 1, 1977

[54] CHANNEL SELECTION MECHANISM FOR AN ELECTRONIC TUNER

[75] Inventors: Tugio Ohigashi; Junichi Ariga, both of Osaka, Japan

[73] Assignee: Matsushita Electric Industrial Co., Ltd., Osaka, Japan

[21] Appl. No.: 699,594

[22] Filed: June 24, 1976

[30] Foreign Application Priority Data

June 25, 1975 Japan .................................. 50-79603

[51] Int. Cl.² .......................... H03J 3/18; H03J 1/02
[52] U.S. Cl. .................................... 334/15; 325/459; 325/464; 334/87; 74/10.29
[58] Field of Search .................... 334/15, 17, 9, 20, 21, 334/86, 87; 325/455, 459, 464, 471; 74/10.29, 10.41

[56] References Cited

U.S. PATENT DOCUMENTS

| | | | |
|---|---|---|---|
| 3,740,679 | 6/1973 | Kimura et al. | 334/87 X |
| 3,845,428 | 10/1974 | Wada et al. | 334/15 X |
| 3,855,962 | 12/1974 | Uchida et al. | 334/86 X |

*Primary Examiner*—Paul L. Gensler
*Attorney, Agent, or Firm*—Lowe, King, Price & Markva

[57] ABSTRACT

A channel selection mechanism for an electronic tuner of a television receiver comprises a motor-driven shaft, a voltage selection rotary switch with the contact arm mounted on the shaft, a channel number indicating drum mounted on the shaft for rotation with the rotary switch, a cam wheel having notches on the periphery thereof and mounted on the shaft for rotation with the rotary switch and the drum, and a cam follower pivoted at one end to engage the working surface of the cam wheel to provide swivel movements. The motor is energized by a motor start switch which is operated until a desired channel is reached. A motor stop switch is provided to operate in response to the swivel movements of the cam follower to deenergize the motor to precisely align the channel indicating number to a window provided in the receiver housing.

5 Claims, 7 Drawing Figures

CHANNEL SELECTION MECHANISM FOR AN ELECTRONIC TUNER

The present invention relates generally to tuners for use in television receivers, and in particular to a channel selection mechanism for an electronic tuner of a television receiver.

A conventional electronic tuner for television reception makes use of the voltage sensitive characteristic of a varactor to control the tuned frequency. Different potentials are selectively applied to the varactor through a plurality of switches each provided for selection of an individual television channel.

An object of the present invention is to provide a channel selection mechanism of a rotary switch type for an electronic tuner which is driven by a motor until a desired channel is reached.

Another object of the invention is to provide a channel selection mechanism which comprises a voltage selecting rotary switch, a channel indicating drum rotatable with the rotary switch, and a VHF-UHF band selection mechanism.

A further object of the invention is to provide a channel selection mechanism which permits selection of channels and frequency bands by means of a single control switch.

The invention will be further described by way of example taken in conjunction with the accompanying drawings, in which.

Figure 2:
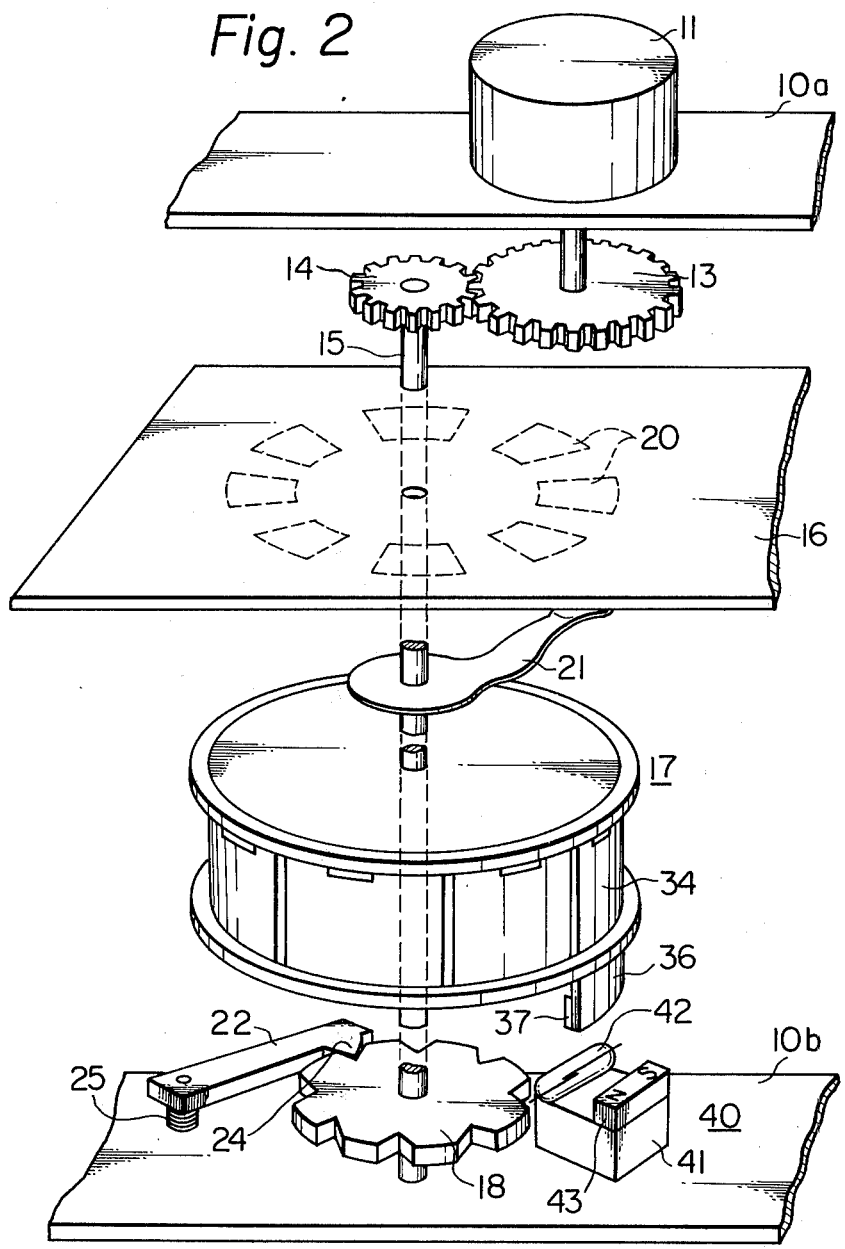
FIG. 2 is an exploded perspective view of the mechanism of the invention.

Referring to the drawings, channel selection mechanism for an electronic tuner in accordance with the present invention comprises a housing 10 which encases various components of the mechanism, and a drive motor 11 mounted on the top wall 10a of the housing with its drive shaft 12 extending downwardly through the top wall. A spur gear 13 is mounted on the shaft 12 in mesh with a spur gear 14 mounted on a shaft 15 which extends through a support plate 16 to the bottom wall 10b of the housing. As clearly shown in FIG. 2, a drum 17 and a cam wheel 18 are mounted on the shaft 15 for rotation therewith. There is mounted underside of the support plate 16 a plurality of electrical contacts 20 equal in number to the number of television channels arranged concentrically about the shaft 15. Between the support plate 16 and the upper surface of the drum 17, a wiper or rotating contact arm 21 is secured to the shaft 15 and in slidable contact with each contact element 20 to constitute a voltage selection rotary switch. A cam follower 22 is pivoted at one end thereof on the bottom wall 10b and has a projecting working surface 24 urged toward the cam surface of wheel 18 by means of a spring 25.

Figure 1:
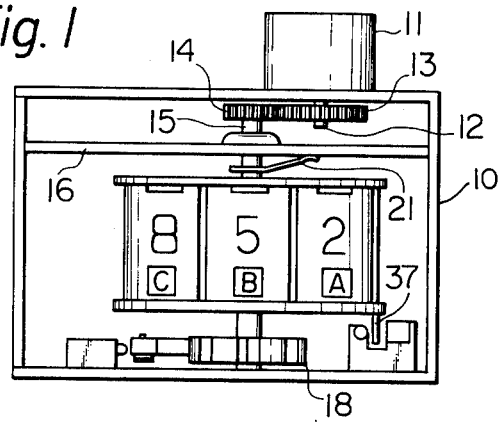
FIG. 1 is a view illustrating the inside of a channel selection mechanism of the invention.
Figure 3:
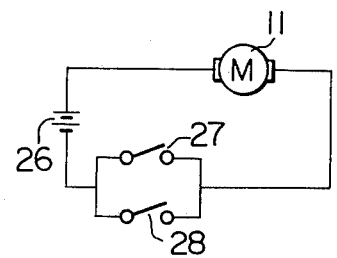
FIG. 3 is a circuit diagram of a drive motor of FIG. 1.
Figure 4:
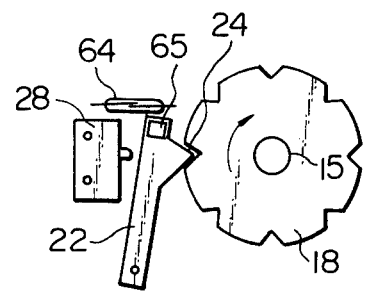
FIG. 4 is a view illustrating the relationship of a cam and a cam follower of the mechanism of the invention.

In FIG. 3, the drive motor 11 is energized by a DC voltage source 26 connected through a manual switch 27 which is connected in parallel to a normally open switch 28 which is located adjacent to the free end of the cam follower 22 to close its contacts when the follower is rotated counterclockwise by the cam surface of the wheel 18 in opposition to the spring 25 (FIG. 4).

Figure 5:
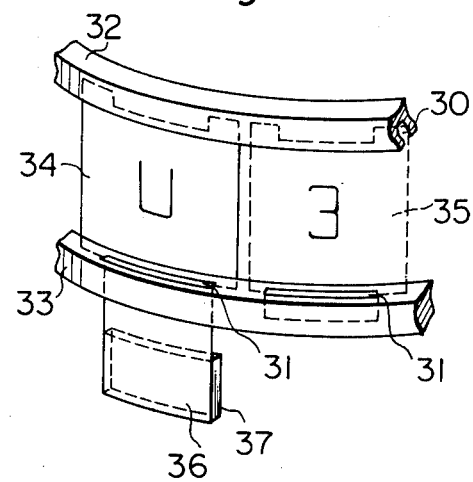
FIGS. 5 and 6 are partial views illustrating a portion of the channel number indicating drum.

In FIG. 5, the drum 17 is provided with a plurality of arcuate slots 30 and 31 on the upper and lower circumferential edges 32 and 33, respectively, to permit film strips 34 and 35 to be snapped into position, the number of slots 31 being eqaul to the number of notches of the cam wheel 18. The films 35 carry numerals indicating the VHF television channels and have their upper and lower ends terminating in the arcuate slots 30, 31, while the film strip 34 carries the UHF marking and has its lower end 36 extending through the slot 31. The lower extension 36 in turn carries a metal number 37 of magnetic shielding material. On the bottom wall 10b of the housing is mounted a UHF mark sensing device 40 which comprises a support 41 carrying a reed switch 42 and a permanent magnet 43 located such that the lower extension 36 of the film 34 may pass through the space provided between the reed switch and the magnet as the drum 17 rotates.

Figure 7:
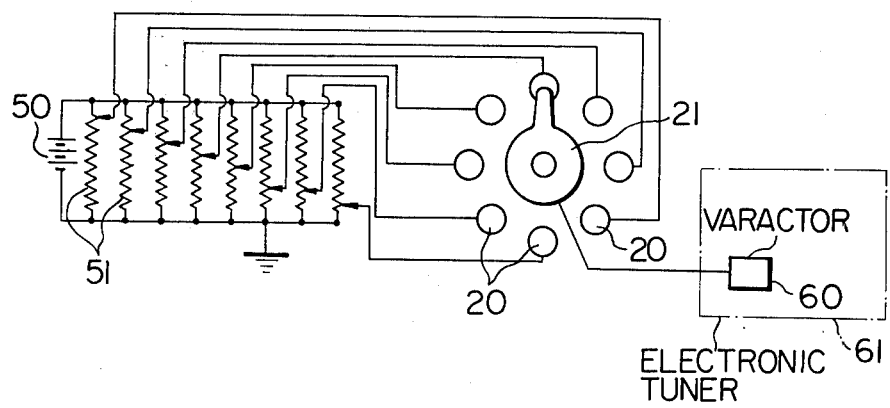
FIG. 7 is a circuit diagram of the voltage selection rotary switch and a connection to an electronic tuner.

In FIG. 7 the electrical contact elements 20 are shown connected to a DC voltage source 50 through the tap point of each of a plurality of variable resistors 51 having their opposite ends connected to the voltage source 50. The wiper 21 is connected to a varactor 60 of a conventional electronic tuner 61 to apply a potential thereto from a selected one of the tap points of variable resistors 51 by rotation thereof. Since the varactor 60 is a voltage sensitive device to provide different capacitances in response to the applied voltage, the variable resistors 51 have their tap points so adjusted to deliver potentials predetermined by the frequencies of the televison channels.

When the switch 27 is depressed to complete a circuit for the motor 11, gear 13 is caused to rotate and whose rotation is transmitted to the shaft 15 through gear 14. The wiper 21, drum 17 and cam wheel 18 are all caused to rotate about the shaft 15. When the working surface 24 of cam follower 22 engages one of the notched portions of the cam surface, switch 28 is caused to open its contacts. As the rotation proceeds, the cam follower 22 rotates counterclockwise by the projecting portions of the cam 18 and closes the contacts of switch 28. The closure of switch 28 enables the motor 11 to keep running even after the manual switch 27 is released. The channel number is visible to the viewer through a window (not shown) of a television receiver encasing. Therefore, the viewer when selecting a channel should operate the switch 27 until the desired channel number is reached. Upon release of the switch 27, the motor 11 will automatically be deenergized when the cam follower 22 comes into engagement with the corresponding notch of the cam 18. This permits the channel indicating number to be aligned precisely to the window on the front panel of the television receiver. With the wiper 21 being positioned making contact with the desired contact element 20, the varactor 60 of the electronic tuner 61 is applied with a corresponding potential to effect tuning of the channel frequency.

Reed switch 42 normally closes its contacts by the magnetic field produced by the magnet 43 to permit the electronic tuner 61 to select channels in the VHF band. When a channel in the UHF band is desired, the film strip 34 carrying the UHF mark becomes visible to the viewer with its lower extension 36 fitted with magnetic metal plate 37 being positioned between the magnet 43 and reed switch 42. The reed switch 42 is caused to open its contacts to permit selection of a channel in the UHF band.

Figure 6:
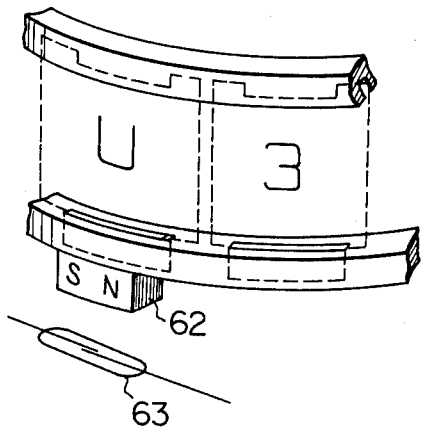

The UHF channel selection is alternatively achieved by providing a permanent magnet 62 beneath the drum edge and a reed switch 63 on a stationary support (not shown) as illustrated in FIG. 6. In this instance, the reed switch 63 closes its contacts only when the magnet is close to the reed switch.

An automatic-frequency control (AFC) reed switch 64 is located adjacent to the free end of the cam follower 22 to which is attached a magnet 65. In response to the counterclockwise movement of cam follower 22, reed switch 64 is excited by the permanent magnet 65 to close its contacts while it opens its contacts to disable automatic frequency control during channel selection intervals (FIG. 4).

What is claimed is:

1. A channel selection mechanism for an electronic tuner having a varactor, comprising, a motor-driven shaft, a plurality of contact elements connected to sources of different potentials, a wiper mounted on the shaft to slidably make contact with each contact element to selectively connect said different potentials to the varactor of the electronic tuner, a channel number indicating drum having a plurality of slots in pairs on the periphery thereof and film strips equal in number to said pairs inserted into said slots, and electromagnetic sensing and switch means mounted stationary relative to the periphery of said drum to detect the proximity thereto of a particular one of said film strips to permit said electronic tuner to switch between the VHF and UHF bands.

2. A channel selection mechanism as claimed in claim 1, wherein said electronic sensing and switch means comprises a reed switch and a permanent magnet mounted in proximity thereto at a spacing therefrom, and wherein said particular film strip is provided with a magnetic metal member mounted to pass through said spacing to block the magnetic flux generated from said magnet, when said drum is rotated about said shaft.

3. A channel selection mechanism as claimed in claim 1, wherein said electronic sensing and switch means comprises a permanent magnet mounted on the drum adjacent to said particular film strip and a reed switch mounted stationary relative to the drum and operable in response to the proximity thereto of said permanent magnet.

4. A channel selection mechanism as claimed in claim 1, further comprising a cam mounted on said shaft and having a plurality of working portions equal in number to said contact elements, a cam follower pivoted at one end to engage the cam to provide swivel movements in opposite directions in response to the working portions of the cam, a motor energization switch, and a motor deenergization switch operable in response to the swivel movements of the cam follower and connected in parallel with the motor energization switch.

5. A channel selection mechanism for an electronic tuner having a varactor, comprising: a drive shaft, a motor for driving the shaft, a plurality of contact elements connected to sources of different potentials, a wiper mounted on the shaft to slidably make contact with each contact element to selectively connect said different potentials to the varactor of said electronic tuner; a channel number indicating drum mounted on said shaft for rotation therewith and provided with a plurality of slots in pairs on the periphery thereof and a plurality of film strips inserted into said pairs of slots, a cam having a plurality of working portions equal in number to said contact elements and mounted on said shaft, a cam follower pivoted at one end to engage the cam to provide swivel movements in opposite directions in response to the engagement with said working portions, a motor start switch connected between a power source for energizing the motor, a motor stop switch operable in response to said swivel movements of the cam follower and connected in parallel to the motor start switch, and electromagnetic sensing and switch means mounted stationarily relative to the periphery of the drum to detect the proximity thereto of a particular one of said film strips.

* * * * *